US007939883B2

(12) United States Patent
Kwon et al.

(10) Patent No.: US 7,939,883 B2
(45) Date of Patent: May 10, 2011

(54) VOLTAGE REGULATING APPARATUS HAVING A REDUCED CURRENT CONSUMPTION AND SETTLING TIME

(75) Inventors: Yong Il Kwon, Gyunggi-do (KR); Joon Hyung Lim, Gyunggi-do (KR); Tah Joon Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 687 days.

(21) Appl. No.: 11/754,129

(22) Filed: May 25, 2007

(65) Prior Publication Data

US 2007/0272988 A1 Nov. 29, 2007

(30) Foreign Application Priority Data

May 26, 2006 (KR) ........................ 10-2006-0047723

(51) Int. Cl.
*H01L 29/66* (2006.01)

(52) U.S. Cl. ........................................ 257/330; 330/253

(58) Field of Classification Search .................. 257/330; 330/253; 328/281
See application file for complete search history.

(56) References Cited

U.S. PATENT DOCUMENTS 5,345,422 A * 9/1994 Redwine .................. 365/189.09
5,898,235 A 4/1999 McClure
5,920,185 A 7/1999 Ozoe
7,224,224 B2 * 5/2007 Sera et al. ..................... 330/253
2003/0048684 A1 * 3/2003 Tanzawa et al. .............. 365/226
2004/0113595 A1 6/2004 Sugiura
2005/0088154 A1 * 4/2005 Sugiura ......................... 323/281
2006/0017496 A1 1/2006 Yamada et al.
2007/0229157 A1 * 10/2007 Bhattacharya et al. ....... 330/253

FOREIGN PATENT DOCUMENTS

JP 03-209695 A 9/1991
JP 04-205115 A 7/1992
JP 5-17712 U 3/1993
JP 06-259150 A 9/1994
JP 10-214121 A 8/1998
JP 10-214487 A 8/1998
JP 2003-029855 A 1/2003
JP 2004-164411 A 6/2004
JP 2005-063231 A 3/2005
JP 2006-39816 A 2/2006

OTHER PUBLICATIONS

Japanese Patent Office, Office Action issued Dec. 22, 2009.

* cited by examiner

*Primary Examiner* — Thanh V Pham
*Assistant Examiner* — Caleb Henry
(74) *Attorney, Agent, or Firm* — Lowe Hauptman Ham & Berner LLP

(57) ABSTRACT

There is disclosed a voltage regulating apparatus with a short settling time and a small current consumption. The voltage regulating apparatus comprises a reference voltage generator including an MOSFET array comprising a plurality of MOSFETs with a structure in which a drain and a source are connected in series with each other, a supply voltage is applied to the drain of the MOSFET located in an end of the MOSFET array and the source of the MOSFET located in another end is grounded, and the reference voltage is a voltage obtained by dividing by the plurality of MOSFETs of the MOSFET array at a predetermined ratio.

11 Claims, 3 Drawing Sheets

VOLTAGE REGULATING APPARATUS HAVING A REDUCED CURRENT CONSUMPTION AND SETTLING TIME

CROSS-REFERENCE TO RELATED APPLICATIONS

This application claims the priority of Korean Patent Application No. 2006-0047723 filed on May 26, 2006, in the Korean Intellectual Property Office, the disclosure of which is incorporated herein by reference.

BACKGROUND OF THE INVENTION

1. Field of the Invention

The present invention relates to a voltage regulating apparatus, and more particularly, to a voltage regulating apparatus capable of reducing current consumption and reducing an amount of time used until stably operating when regulating a supply voltage provided from a power supply into a voltage required for operating a semiconductor device.

2. Description of the Related Art

In general, semiconductor devices operate by receiving a driving voltage provided by an external power supply. Since a size of the voltage provided from the power supply is fixed, to drive semiconductor devices operating by a voltage with a different size from the output voltage of the power supply, a voltage regulating apparatus for generating a voltage with a size capable of driving a corresponding semiconductor device by regulating the voltage outputted from the power supply is required.

FIG. 1 is a circuit diagram illustrating a conventional voltage regulating apparatus.

Referring to FIG. 1, the conventional voltage regulating apparatus includes a voltage comparator 11, a current sink unit 12, and a voltage output unit 13. The voltage comparator 11 includes a plurality of metal-oxide-semiconductor field-effect transistors (MOSFETs) 111 to 114 with a circuit structure of a differential amplifier and compares a reference voltage $V_{ref}$ inputted outside with an output voltage of the voltage regulating apparatus. The current sink unit 12 may be embodied as an MOSFET and provides a sink current to the voltage comparator 11. Also, the voltage output unit 13 includes an MOSFET 131 operating according to a voltage comparison result and resistors R1 and R2.

The voltage regulating apparatus applies the reference voltage $V_{ref}$ to a gate of the MOSFET 111 and applies the output voltage to a gate of the MOSFET 114 to compare sizes of the reference voltage $V_{ref}$ and applies the output voltage. When the applied output voltage is smaller than the reference voltage $V_{ref}$, a voltage across a drain of the MOSFET 111 becomes "low". Since the voltage across the drain of the MOSFET 111 is applied to a gate of the MOSFET 131 of the voltage output unit 13, the MOSFET 131 is turned "on". Accordingly, the output voltage is increased. On the other hand, when the output voltage is smaller than the reference voltage $V_{ref}$, the output voltage is decreased by similar operations. As the increase and decrease of the output voltage are repeated, a voltage across the gate of the MOSFET 114 is regulated to be a size identical with the reference voltage $V_{ref}$.

In the conventional voltage regulating apparatus, a band-gap voltage generated by a band-gap circuit is generally used as the reference voltage $V_{ref}$. There is a problem of a large current consumption in the band-gap circuit itself. Also, since the conventional voltage regulating apparatus provides the sink current via one MOSFET 121, there is a problem of a very long settling time for regulating the output voltage to be identical with the reference voltage $V_{ref}$ in an apparatus requiring a small current consumption.

Accordingly, a voltage regulating apparatus capable of reducing current consumption as well as reducing a settling time has been required.

SUMMARY OF THE INVENTION

An aspect of the present invention provides a voltage regulating apparatus with a short settling time and a small current consumption.

According to an aspect of the present invention, there is provided a voltage regulating apparatus including: a reference voltage generator regulating a supply voltage and providing a reference voltage; a voltage comparator including a first metal-oxide-semiconductor field-effect transistor (MOSFET) receiving the reference voltage via a gate, a second MOSFET having a source connected to a drain of the first MOSFET and a drain to which the supply voltage is applied, a third MOSFET having a gate connected to a gate of the second MOSFET, a drain to which the supply voltage is applied, and a source electrically connected with the gate, and a fourth MOSFET having a drain connected to the source of the third MOSFET and a source connected to a source of the first MOSFET and comparing the reference voltage with a voltage of a gate of the fourth MOSFET; a current sinker including a first current sink unit connected to the sources of the first MOSFET and the fourth MOSFET to form a current sink and a second current sink unit connected to the sources of the first MOSFET and the fourth MOSFET to form a current sink and operating according to a voltage of the gate of the fourth MOSFET; and a voltage output unit including a fifth MOSFET having a gate connected to the drain of the first MOSFET, a drain to which the supply voltage is applied, and a source connected to the gate of the fourth MOSFET and providing a voltage of the source of the fifth MOSFET as an output voltage.

The reference voltage generator may include an MOSFET array including a plurality of MOSFETs with a structure in which a drain and a source are connected in series with each other. The supply voltage may be applied to the drain of the MOSFET located in an end of the MOSFET array and the source of the MOSFET located in another end is grounded. The reference voltage may be a voltage obtained by dividing by the plurality of MOSFETs of the MOSFET array at a predetermined ratio.

The first current sink unit may include an MOSFET having a gate connected to the source of one of the plurality of MOSFETs of the MOSFET array, a drain connected to the sources of the first MOSFET and the fourth MOSFET, and a source grounded.

The reference voltage generator may include: a first MOSFET stage including a plurality of MOSFETs with a structure in which a drain and a source are connected in series with each other, the supply voltage applied to the drain of the MOSFET located in an end of the first MOSFET stage; a second MOSFET stage including a plurality of MOSFETs with a structure in which a drain and a source are connected in series with each other, a gate is connected to a gate of the MOSFET of the first MOSFET stage one by one, and the gate and the drain are electrically connected with each other, the supply voltage applied to the drain of the MOSFET located in an end of the second MOSFET stage; and a current mirror stage including a first mirror MOSFET having a drain connected to the source of the MOSFET located in another end of the first MOSFET stage, a gate electrically connected with the drain, and a source grounded and a second mirror MOSFET having a drain connected to the source of the MOSFET located in another end of the second MOSFET stage, a gate connected to the gate of the first mirror MOSFET, and a source grounded.

The current mirror stage may mirror a current flowing through the first MOSFET stage to allow a current having a size regulated according to a ratio between widths of the first mirror MOSFET and the second mirror MOSFET to flow through the second MOSFET stage.

The first current sink unit may include a first sink MOSFET having a gate connected to the gate of the first mirror MOSFET, a drain connected to the sources of the first MOSFET and the fourth MOSFET, and a source grounded. The first current sink unit may mirror a current flowing through the first MOSFET stage to allow a current having a size regulated according to a ratio between widths of the first mirror MOSFET and the first sink MOSFET to flow through the first sink unit.

The second current sink may include: an inverter connected to the gate of the fourth MOSFET and inverting the voltage of the gate of the fourth MOSFET; and an MOSFET having a drain connected to the sources of the first MOSFET and the fourth MOSFET, a source grounded, and a gate to which the inverted voltage is applied. The second current sink may be applied to reduce a settling time for outputting an output voltage identical with the reference voltage when the apparatus initially operates.

The voltage comparator may further include a plurality of MOSFETs having a drain connected to the drain of the first MOSFET, a source connected to the drain of the fourth MOSFET, and a gate to which the supply voltage is applied. The plurality of MOSFETs connected between the first MOSFET and the fourth MOSFET may operate as resistors to prevent an excessive voltage increase capable of occurring during the settling time.

The voltage output unit may further include an MOSFET having a drain connected to the gate of the fourth MOSFET and a gate and a source grounded, thereby having an approximately infinite resistance value. An unnecessary current consumption may be reduced by applying the MOSFET having the infinite resistance value.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
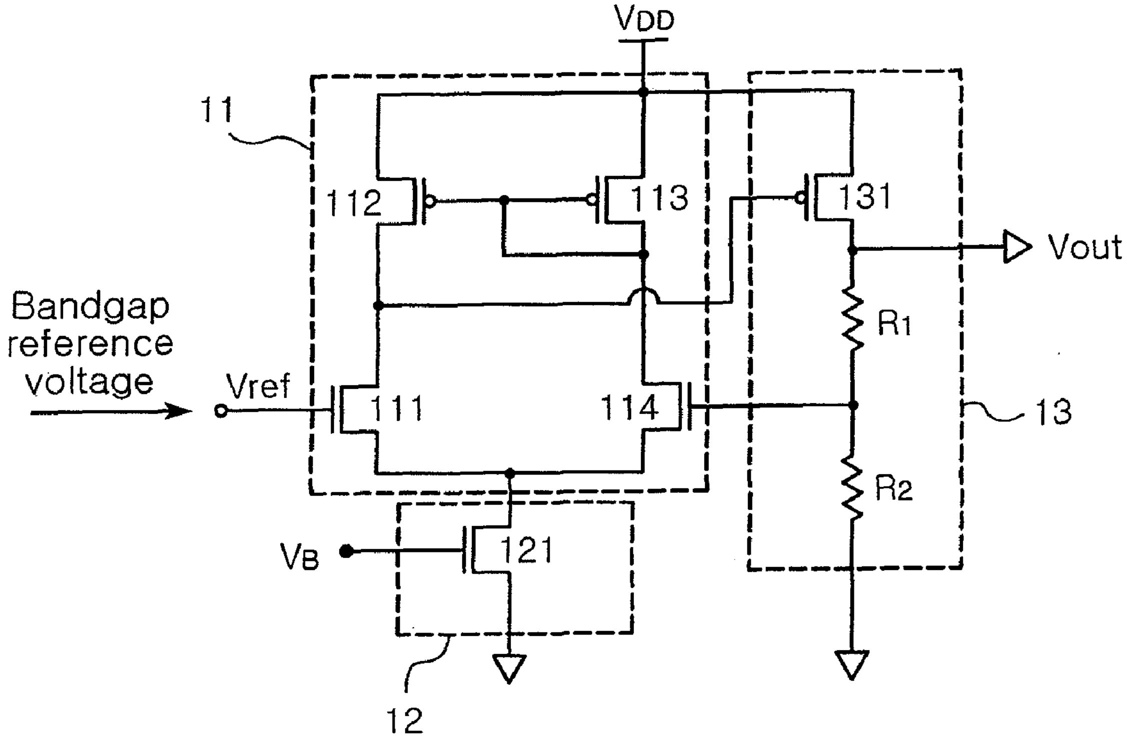
Prior art FIG. 1
FIG. 1 is a circuit diagram illustrating a conventional voltage regulating apparatus.

Hereinafter, the present invention will now be described more fully with reference to the accompanying drawings, in which exemplary embodiments of the invention are shown. The present invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Figure 2:
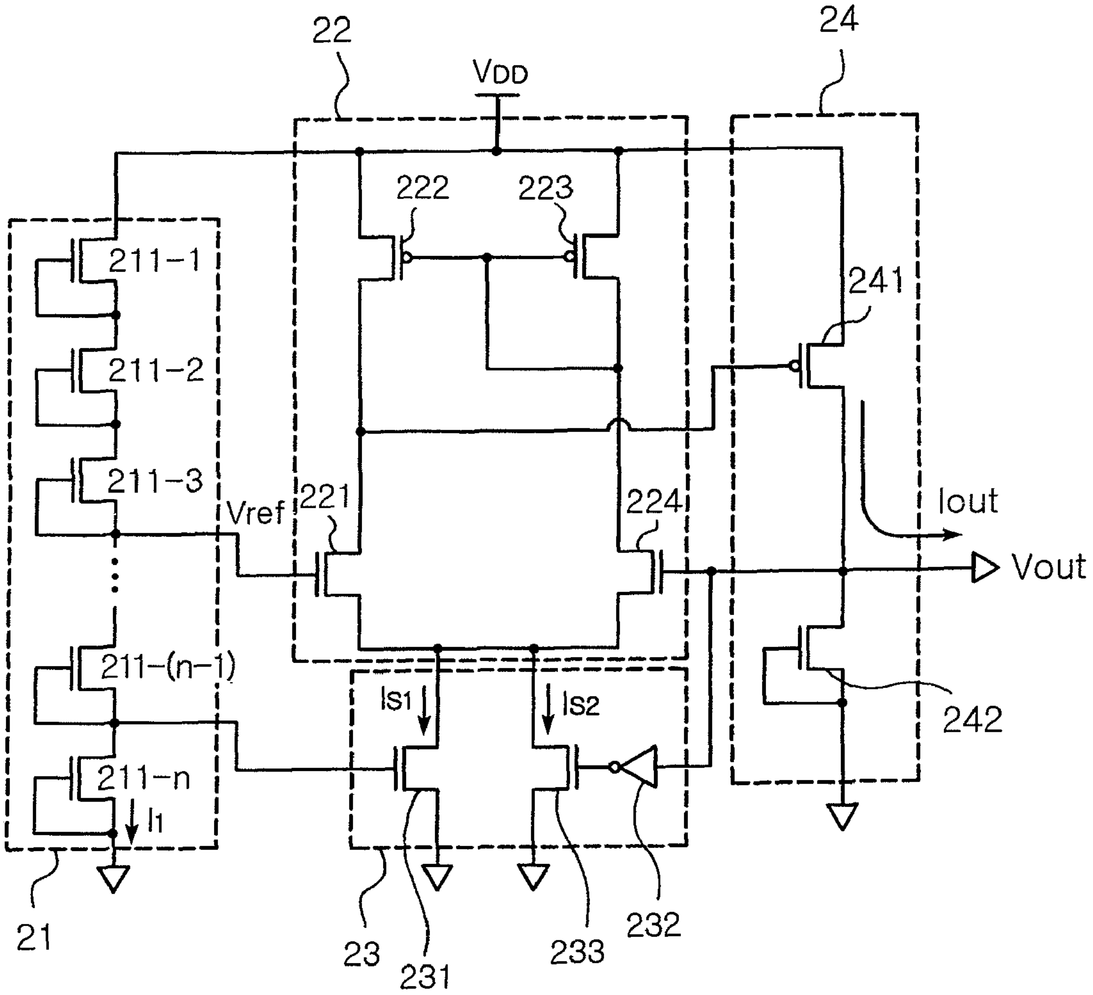
FIG. 2 is a circuit diagram illustrating a voltage regulating apparatus according to an embodiment of the present invention.
Figure 3:
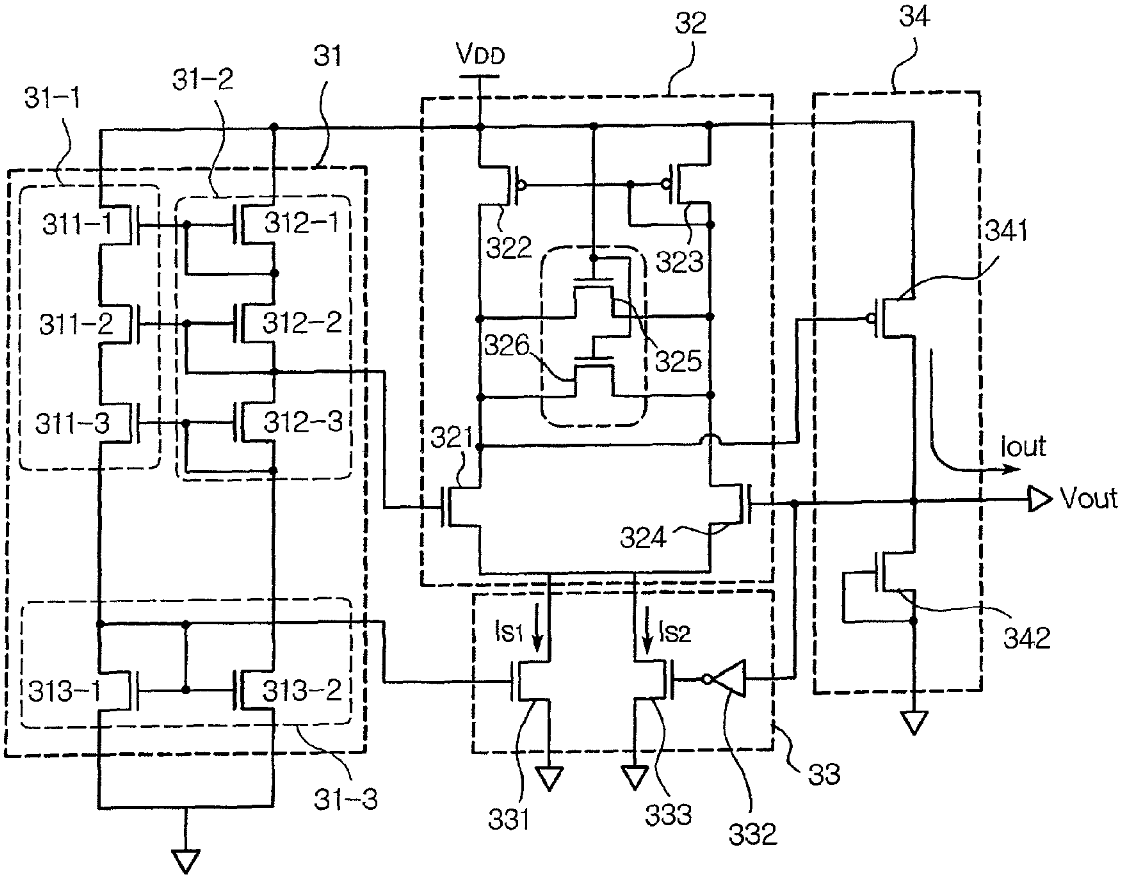
FIG. 3 is a circuit diagram illustrating a voltage regulating apparatus according to another embodiment of the present invention.

FIGS. 2 and 3 are circuit diagrams illustrating voltage regulating apparatuses according to two embodiments of the present invention, respectively.

Referring to FIG. 2, the voltage regulating apparatus according to an embodiment of the present invention includes a reference voltage generator 21, a voltage comparator 22, a current sinker 23, and a voltage output unit 24.

The reference voltage generator 21 regulates a supply voltage VDD and provides a reference voltage Vref. For example, generally, a supply voltage of 3V may be provided and the reference voltage generator 21 may regulate the 3V into 1.8V used to drive a semiconductor device.

In the present embodiment, the reference voltage generator 21 may be embodied as an MOSFET array including a plurality of MOSFETs 211-1 to **211-*n* with a structure in which a drain and a source are connected in series with each other. Each MOSFET included in the MOSFET array has a gate electrically connected to the source, and respective MOSFETs 211-1 to 211-*n* are connected in series in which the drain is connected with the source. Also, the reference voltage generator 21 may output a reference voltage Vref from one of a connection node of each MOSFET connected in series. That is, the plurality of MOSFETs 211-1 to 211-*n* divide the supply voltage applied to the MOSFET array, and a user may select a suitable connection node as an output end of the reference voltage Vref. Particularly, since the reference voltage generator 21** applied t the present embodiment is embodied by only a plurality of MOSFETs, a size thereof is small and a voltage is divided to provide a reference voltage approximately without current consumption.

The voltage comparator 22 has a structure of a differential amplifying circuit, together with the current sinker 23. The voltage comparator 22 compares the reference voltage Vref provided from the reference voltage generator 21 with an output voltage of the voltage regulating apparatus and controls an MOSFET in the voltage output unit 24 according to a comparison result.

In detail, the voltage comparator 22 includes a first MOSFET 221 receiving the reference voltage Vref via a gate, a second MOSFET 222 having a source connected to a drain of the first MOSFET 221 and a drain to which the supply voltage is applied, a third MOSFET 223 having a gate connected to a gate of the second MOSFET 222, a drain to which the supply voltage is applied, and a source electrically connected with the gate, and a fourth MOSFET 224 having a drain connected to the source of the third MOSFET 223 and a source connected to a source of the first MOSFET 221 and comparing the reference voltage Vref with a voltage of a gate of the fourth MOSFET 224. The drain of the first MOSFET 221 is connected to a gate of a fifth MOSFET 241 of the voltage output unit 24. In the MOSFETs, the first and fourth MOSFETs 221 and 224 may be embodied as n-type MOSFETs, and the second, third, and fifth MOSFETs 222, 223, and 225 may be embodied as p-type MOSFETs.

The voltage comparator 22 having a circuit structure as described above compares the reference voltage Vref with an output voltage Vout. When the output voltage Vout is smaller than the reference voltage Vref, a node connected with the drain of the first MOSFET 221 becomes “low” and the fifth MOSFET 241 having the gate connected with the drain of the first MOSFET 221 is turned “on”, thereby increasing the output voltage Vout. On the other hand, when the output voltage Vout is greater than the reference voltage Vref, the node connected with the drain of the first MOSFET 221 becomes "high" and the fifth MOSFET 241 having the gate connected with the drain of the first MOSFET 221 becomes "off", thereby decreasing the output voltage Vout. As the increase and decrease are repeated, the output voltage Vout is regulated as a voltage value identical with the reference voltage Vref. In the present specification, a settling time designates a time used for outputting the output voltage Vout with a voltage value identical with the reference voltage Vref.

For the differential operations of the voltage comparator 22, the voltage comparator 22 has to include the current sinker 23 to sink a current from a supply voltage. The current sinker 23 includes a first current sink unit and a second unit connected to nodes connected to the sources of the first MOSFET 221 and the fourth MOSFET 224.

In the present embodiment, the first current sink unit is formed of an MOSFET 231 having a gate connected to the source of one of the plurality of MOSFETs included in the MOSFET array forming the reference voltage generator 21, a drain connected to the sources of the first MOSFET 221 and the fourth MOSFET 224, and a source grounded. When a current flowing through the MOSFET array of the reference voltage generator 21, the MOSFET 231 forming the first current sink unit is turned "on" to allow a sink current $I_{S1}$ to flow.

Also, the second current sink unit is connected to the node connected with the sources of the first MOSFET 221 and the fourth MOSFET 224 and operates according to the voltage of the gate of the fourth MOSFET 224, namely, the output voltage Vout. In detail, the second current sink unit includes an inverter 232 connected to the gate of the fourth MOSFET 224 and inverting the voltage of the gate of the fourth MOSFET 224; and an MOSFET 233 having a drain connected to the sources of the first MOSFET 221 and the fourth MOSFET 224, a source grounded, and a gate to which the inverted voltage is applied. The MOSFETs 231 and 233 included in the first and second current sink units may be n-type MOSFETs, respectively.

The second current sink unit supplies the sink current when the voltage regulating apparatus initially operates, namely, only during the settling time. As a result, due to a sink current $I_{S2}$ by the second current sink unit in addition to the sink current $I_{S1}$ by the first current sink unit, a larger amount of sink currents are provided to the voltage comparator 22 to more quickly operate. Accordingly, the settling time for the initial operation of the voltage regulating apparatus may be reduced. The operations of the second current sink unit will be described in detail. When the voltage regulating apparatus starts operating, since the output voltage Vout is "low", the gate of the MOSFET 233 becomes "high" by the inverter 232 to be turned "on", thereby supplying the sink current $I_{S2}$. Then, when the output voltage Vout is fixed and outputted, namely, becomes "high", an output of the inverter 232 becomes "low" and the MOSFET 233 is turned "off". Accordingly, the second current sink unit stops operating, and only the sink current $I_{S1}$ by the first current sink unit is provided to the voltage comparator 22.

As described above, according to an exemplary embodiment of the present invention, the additional sink current $I_{S2}$ is provided only while the voltage regulating apparatus initially operates and outputs regularly, thereby reducing the settling time without largely increasing current consumption.

The voltage output unit 24 includes the fifth MOSFET 241 having the gate connected to the drain of the first MOSFET 221, a drain to which the supply voltage is applied, and a source connected to the gate of the fourth MOSFET 224. In addition, the voltage output unit 24 may further include an MOSFET 242 having a drain connected to the gate of the fourth MOSFET 224, namely, the output end outputting the output voltage Vout, and a gate and a source grounded, thereby having an approximately infinite resistance value. The fifth MOSFET 241 may be a p-type MOSFET, and the MOSFET 242 having the infinite resistance value may be an n-type MOSFET.

As described above, since the gate the fifth MOSFET 241 is connected with the drain of the first MOSFET 221 of the voltage comparator 22, the fifth MOSFET 241 is alternately turned "on" and "off" according to the result of comparing the reference voltage Vref with the output voltage Vout to output the output voltage Vout identical with the reference voltage Vref. Also, the MOSFET 242 fixes a resistance between the output end and a ground to be infinite, thereby supplying an output current Iout without being consumed in the voltage regulating apparatus.

FIG. 3 is a circuit diagram illustrating a voltage regulating apparatus according to another embodiment of the present invention. The embodiment illustrated in FIG. 3 will be described in detail in elements and operations different from the embodiment described referring to FIG. 2. However, the description of similar or identical elements and operations will be omitted.

Referring to FIG. 3, a reference voltage generator 31 of the voltage regulating apparatus includes a first MOSFET stage 31-1, a second MOSFET stage 31-2, and a current mirror stage 31-3.

The first MOSFET stage 31-1 includes a plurality of MOSFETs 311-1 to 311-3 with a structure in which a drain and a source are connected in series with each other, and a supply voltage VDD is applied to the drain of the MOSFET 311-1 located in an end of the plurality of MOSFETs 311-1 to 311-3 of the first MOSFET stage.

The second MOSFET stage 31-2 includes a plurality of MOSFETs 312-1 to 312-3 with a structure in which a drain and a source are connected in series with each other, a gate is connected to a gate of the plurality of MOSFETs 311-1 to 311-3 of the first MOSFET stage 31-1 one by one, and the gate and the drain are electrically connected with each other. The supply voltage VDD is applied to the drain of the MOSFET 312-1 located in an end of the second MOSFET stage 31-2.

The current mirror stage 31-3 includes a first mirror MOSFET 313-1 having a drain connected to the source of the MOSFET 313-3 located in another end of the first MOSFET stage 31-1, a gate electrically connected with the drain, and a source grounded and a second mirror MOSFET 313-2 having a drain connected to the source of the MOSFET 312-3 located in another end of the second MOSFET stage, a gate connected to the gate of the first mirror MOSFET, and a source grounded. The current mirror stage 31-3 mirrors a current flowing through the first MOSFET stage 31-1 to allow a current having a size regulated according to a ratio between widths of the first mirror MOSFET 313-1 and the second mirror MOSFET 313-2 to flow through the second MOSFET stage 31-2.

The reference voltage generator 31 provides a reference voltage Vref that is a voltage obtained by dividing by the plurality of MOSFETs 312-1 to 312-3 of the second MOSFET stage at a predetermined ratio.

In the present embodiment, the reference voltage generator 31 may more stably provide a current by providing the current obtained by mirroring the current flowing through the first MOSFET stage 31-1 to the second MOSFET stage 31-2 to divide the voltage. Therefore, a problem of size variation of the reference voltage Vref may be more effectively solved.

In the present embodiment, a sink current $I_{S1}$ flowing through a first current sink unit of a current sinker 33 may be provided by the current mirror stage 31-3 of the reference voltage generator 31. The first current sink unit of the current sinker 33 includes a first sink MOSFET 331 having a gate connected to the gate of the first mirror MOSFET 313-1, a drain connected to the sources of the first MOSFET 321 and the fourth MOSFET 324, and a source grounded. In such the circuit structure, the first sink MOSFET 331 and the first mirror MOSFET 313-1 form a current mirror circuit. Accordingly, the current having the size regulated according to a ratio between widths of the first mirror MOSFET 313-1 and the first sink MOSFET 331 by mirroring the current flowing through a first MOSFET stage 31-1 flows through the first sink unit.

Also, in the present embodiment, a voltage comparator 32 further includes a plurality of MOSFETs 325 and 326 having a drain connected to the drain of the first MOSFET 321, a source connected to the drain of the fourth MOSFET 324, and a gate to which the supply voltage VDD is applied. The plurality of MOSFETs 325 and 326 connected to the drain of the fourth MOSFET 324 acts as resistors to allow a stable current to be supplied during the settling time.

As described above, according to an exemplary embodiment of the present invention, a sink current is additionally supplied during a settling time according to an output voltage, thereby reducing current consumption as well as reducing the settling time of a voltage regulating apparatus.

Also, according to an exemplary embodiment of the present invention, since a reference voltage generator is embodied by only a plurality of MOSFETs, thereby reducing a size thereof and providing a reference voltage by dividing a voltage approximately without current consumption.

While the present invention has been shown and described in connection with the exemplary embodiments, it will be apparent to those skilled in the art that modifications and variations can be made without departing from the spirit and scope of the invention as defined by the appended claims.

What is claimed is:

1. A voltage regulating apparatus comprising:

a reference voltage generator for regulating a supply voltage and providing a reference voltage;

a voltage comparator comprising a first metal-oxide-semiconductor field-effect transistor (MOSFET) for receiving the reference voltage via a gate, a second MOSFET having a source connected to a drain of the first MOSFET and a drain to which the supply voltage is applied, a third MOSFET having a gate connected to a gate of the second MOSFET, a drain to which the supply voltage is applied, and a source electrically connected with the gate, and a fourth MOSFET having a drain connected to the source of the third MOSFET and a source connected to a source of the first MOSFET, the voltage comparator configured to compare the reference voltage with a voltage of a gate of the fourth MOSFET;

a current sinker comprising a first current sink unit connected to the sources of the first MOSFET and the fourth MOSFET to form a current sink and a second current sink unit connected to the sources of the first MOSFET and the fourth MOSFET to form a current sink and to operate according to a voltage of the gate of the fourth MOSFET; and a voltage output unit comprising a fifth MOSFET having a gate connected to the drain of the first MOSFET, a drain to which the supply voltage is applied, and a source connected to the gate of the fourth MOSFET and to provide a voltage of the source of the fifth MOSFET as an output voltage;

wherein the second current sink comprises:

an inverter connected to the gate of the fourth MOSFET for inverting the voltage of the gate of the fourth MOSFET; and a MOSFET having a drain connected to the sources of the first MOSFET and the fourth MOSFET, a source grounded, and a gate to which the inverted voltage is applied.

2. The apparatus of claim 1, wherein the reference voltage generator comprises a MOSFET array comprising a plurality of MOSFETs with a structure in which a drain and a source are connected in series with each other, the supply voltage is applied to the drain of the MOSFET located in an end of the MOSFET array and the source of the MOSFET located in another end is grounded, and the reference voltage is a voltage obtained by dividing by the plurality of MOSFETs of the MOSFET array at a predetermined ratio.

3. The apparatus of claim 2, wherein the first current sink unit comprises a MOSFET having a gate connected to the source of one of the plurality of MOSFETs of the MOSFET array, a drain connected to the sources of the first MOSFET and the fourth MOSFET, and a source grounded.

4. The apparatus of claim 1, wherein the reference voltage generator comprises:

a first MOSFET stage comprising a plurality of MOSFETs with a structure in which a drain and a source are connected in series with each other, wherein the supply voltage is configured to be applied to the drain of the MOSFET located in an end of the first MOSFET stage;

a second MOSFET stage comprising a plurality of MOSFETs with a structure in which a drain and a source are connected in series with each other, a gate is connected to a gate of the MOSFET of the first MOSFET stage one by one, and the gate and the drain are electrically connected with each other, the supply voltage applied to the drain of the MOSFET located in an end of the second MOSFET stage; and a current mirror stage comprising a first mirror MOSFET having a drain connected to the source of the MOSFET located in another end of the first MOSFET stage, a gate electrically connected with the drain, and a source grounded and a second mirror MOSFET having a drain connected to the source of the MOSFET located in another end of the second MOSFET stage, a gate connected to the gate of the first mirror MOSFET, and a source grounded and mirroring a current flowing through the first MOSFET stage to allow a current having a size regulated according to a ratio between widths of the first mirror MOSFET and the second mirror MOSFET to flow through the second MOSFET stage, wherein the reference voltage is a voltage obtained by dividing by the plurality of MOSFETs of the second MOSFET stage at a predetermined ratio.

5. The apparatus of claim 4, wherein the first current sink unit comprises a first sink MOSFET having a gate connected to the gate of the first mirror MOSFET, a drain connected to the sources of the first MOSFET and the fourth MOSFET, and a source grounded and mirrors the current flowing through the first MOSFET stage to allow the current having a size regulated according to a ratio between widths of the first mirror MOSFET and the first sink MOSFET to flow through the first sink unit.

6. A voltage regulating apparatus comprising:

a reference voltage generator for regulating a supply voltage and providing a reference voltage;

a voltage comparator comprising a first metal-oxide-semiconductor field-effect transistor (MOSFET) for receiving the reference voltage via a gate, a second MOSFET having a source connected to a drain of the first MOSFET and a drain to which the supply voltage is applied, a third MOSFET having a gate connected to a gate of the second MOSFET, a drain to which the supply voltage is applied, and a source electrically connected with the gate, and a fourth MOSFET having a drain connected to the source of the third MOSFET and a source connected to a source of the first MOSFET, the voltage comparator configured to compare the reference voltage with a voltage of a gate of the fourth MOSFET;

a current sinker comprising a first current sink unit connected to the sources of the first MOSFET and the fourth MOSFET to form a current sink and a second current sink unit connected to the sources of the first MOSFET and the fourth MOSFET to form a current sink and for operating according to a voltage of the gate of the fourth MOSFET; and a voltage output unit comprising a fifth MOSFET having a gate connected to the drain of the first MOSFET, a drain to which the supply voltage is applied, and a source connected to the gate of the fourth MOSFET, the voltage output unit configured to provide a voltage of the source of the fifth MOSFET as an output voltage;

wherein the reference voltage generator comprises:

a first MOSFET stage comprising a plurality of MOSFETs with a structure in which a drain and a source are connected in series with each other, the supply voltage applied to the drain of the MOSFET located in an end of the first MOSFET stage;

a second MOSFET stage comprising a plurality of MOSFETs with a structure in which a drain and a source are connected in series with each other, a gate is connected to a gate of the MOSFET of the first MOSFET stage one by one, and the gate and the drain are electrically connected with each other, the supply voltage applied to the drain of the MOSFET located in an end of the second MOSFET stage; and a current mirror stage comprising a first mirror MOSFET having a drain connected to the source of the MOSFET located in another end of the first MOSFET stage, a gate electrically connected with the drain, and a source grounded and a second mirror MOSFET having a drain connected to the source of the MOSFET located in another end of the second MOSFET stage, a gate connected to the gate of the first mirror MOSFET, and a source grounded and mirroring a current flowing through the first MOSFET stage to allow a current having a size regulated according to a ratio between widths of the first mirror MOSFET and the second mirror MOSFET to flow through the second MOSFET stage, wherein the reference voltage is a voltage obtained by dividing by the plurality of MOSFETs of the second MOSFET stage at a predetermined ratio.

7. The apparatus of claim 6, wherein the first current sink unit comprises a first sink MOSFET having a gate connected to the gate of the first mirror MOSFET, a drain connected to the sources of the first MOSFET and the fourth MOSFET, and a source grounded and mirrors the current flowing through the first MOSFET stage to allow the current having a size regulated according to a ratio between widths of the first mirror MOSFET and the first sink MOSFET to flow through the first sink unit.

8. The apparatus of claim 6, wherein the second current sink comprises:

an inverter connected to the gate of the fourth MOSFET and inverting the voltage of the gate of the fourth MOSFET; and a MOSFET having a drain connected to the sources of the first MOSFET and the fourth MOSFET, a source grounded, and a gate to which the inverted voltage is configured to be applied.

9. The apparatus of claim 6, wherein the voltage comparator further comprises a plurality of MOSFETs having a drain connected to the drain of the first MOSFET, a source connected to the drain of the fourth MOSFET, and a gate to which the supply voltage is applied.

10. The apparatus of claim 6, wherein the voltage output unit further comprises a MOSFET having a drain connected to the gate of the fourth MOSFET and a gate and a source grounded, thereby having an approximately infinite resistance value.

11. The apparatus of claim 6, wherein the source of the second MOSFET is directly connected to the drain of the first MOSFET.

* * * * *